(12) United States Patent
Thornton

(10) Patent No.: US 7,039,075 B2
(45) Date of Patent: May 2, 2006

(54) FIBER EXTENDED, SEMICONDUCTOR LASER

(76) Inventor: Robert L. Thornton, 19 E. Portola Ave., Los Altos, CA (US) 94022

( * ) Notice: Subject to any disclaimer, the term of this patent is extended or adjusted under 35 U.S.C. 154(b) by 0 days.

(21) Appl. No.: 10/411,637

(22) Filed: Apr. 11, 2003

(65) Prior Publication Data
US 2004/0202218 A1 Oct. 14, 2004

(51) Int. Cl.
H01S 3/30 (2006.01)
(52) U.S. Cl. ............................................ 372/6; 372/75
(58) Field of Classification Search .................... 372/6, 372/9, 18, 43, 50, 70, 75
See application file for complete search history.

(56) References Cited

U.S. PATENT DOCUMENTS

| | | | |
|---|---|---|---|
| 5,796,771 A | 8/1998 | DenBaars et al. | 372/75 |
| 5,933,444 A | 8/1999 | Molva et al. | 372/75 |
| 5,982,802 A * | 11/1999 | Thony et al. | 372/75 |
| 5,993,444 A * | 11/1999 | Ammar et al. | 372/75 |
| 6,064,786 A * | 5/2000 | Cunningham et al. | 385/38 |
| 6,263,002 B1 * | 7/2001 | Hsu et al. | 372/6 |
| 6,625,363 B1 * | 9/2003 | Carter et al. | 385/127 |
| 6,801,687 B1 * | 10/2004 | Pierce | 385/28 |
| 6,879,442 B1 * | 4/2005 | Pezeshki | 359/626 |
| 2001/0001005 A1 * | 5/2001 | Jiang et al. | 372/99 |
| 2002/0087768 A1 | 7/2002 | Thornton | 358/3.06 |
| 2002/0159487 A1 * | 10/2002 | Thornton et al. | 372/26 |
| 2002/0191928 A1 * | 12/2002 | Carter et al. | 385/127 |
| 2003/0156617 A1 * | 8/2003 | Baney et al. | 372/96 |
| 2003/0185269 A1 * | 10/2003 | Gutin | 372/108 |
| 2003/0214992 A1 * | 11/2003 | Lester et al. | 372/50 |
| 2004/0028091 A1 * | 2/2004 | Baev et al. | 372/6 |
| 2004/0197063 A1 * | 10/2004 | Changdar et al. | 385/127 |

OTHER PUBLICATIONS

Fiedler et al.; "Design of VCSEL's for Feedback Insensitive Data Transmission and External Cavity Active Mode-Locking"; □□IEEE Journal of Selected Topics in Quantum Electronics, vol. 1, No. 2, Jun. 1995.*

Fiedler et al., *"Design of VCSEL's for Feedback Insensitive Data Transmission and External Cavity Active Mode-Locking", IEEE Journal of Selected Topics in Quantum Electronics*, vol. 1, No. 2, Jun. 1995, pp. 442-450.

McAleavey et al., *"Narrow Linewidth, Tunable Tm3+-Doped Fluroide Fiber Laser for Optical-Based Hydrocarbon Gas Sensing", IEEE Journal of Selected Topincs in Quantum Electronics*, vol. 3, No. 4, Aug. 1997, pp. 1103-1111.

Booth et al., *"Operation of Diode Laser Pumped Tm3+ ZBLAN Upconversion Fiber Laser at 482 nm", IEEE Journal of Quantum Electronics*, vol. 32, No. 1, Jan. 1996, pp. 118-123.

U.S. Appl. No. 10/411,636, "Control System for a Semiconductor Laser".

* cited by examiner

*Primary Examiner*—Tuyet Vo
*Assistant Examiner*—Leith Al-Nazer
(74) *Attorney, Agent, or Firm*—W. Douglas Carothers, Jr.

(57) ABSTRACT

A semiconductor laser, such as a vertical cavity, surface emitting laser (VCSEL) is coupled to an optical fiber. The other end of the optical fiber has a reflector, so as to provide a fiber-extended cavity for the VCSEL. Such a construction is useful for providing modal stability to the VCSEL or for forming a mode-locked VCSEL. The optical fiber may be a graded index fiber. In such a case, the fiber length may be selected to have an integral number of quarter pitch lengths. The fiber may be doped with an excitable species and lies within a fiber laser cavity. A semiconductor laser may pump the fiber laser, yielding an emission wavelength beyond the scope of the conventional semiconductor laser.

64 Claims, 11 Drawing Sheets

FIBER EXTENDED, SEMICONDUCTOR LASER

FIELD OF THE INVENTION

The present invention is directed generally to lasers, and more particularly to semiconductor lasers such as vertical cavity, surface emitting semiconductor lasers (VCSELs).

BACKGROUND

Semiconductor lasers are key elements in the advancing performance of many systems, such as optical fiber communications, optical data storage, laser printing, full color displays, biochemical monitoring, optical clock generation and quantum key distribution.

Vertical cavity, surface-emitting lasers (VCSELs) have become well established as low cost light sources for short distance data communications applications. There is extensive interest in extending the utility of VCSELs. However, barriers to further applications include efficient emission at targeted wavelengths and transverse modal properties. In particular, as a result of their very short cavities, VCSELs generally offer the benefit of single longitudinal mode emission, but at the expense of limited output power in fundamental transverse mode.

SUMMARY OF THE INVENTION

It is therefore desirable to fabricate VCSEL devices in which the transverse modal properties are stabilized at high, single longitudinal mode, output power levels. It is further desirable for certain applications to stabilize the transverse emission properties while introducing a well controlled multiple longitudinal mode characteristic. It is further desirable to extend the emission wavelength range accessible to the VCSEL device to include various wavelength of technological importance.

In view of the above, the present invention is directed to increasing the performance of the VCSEL in at least three areas. First, an increased single mode power would be useful in, for example, optical communications, to increase the coupled power into single mode fibers, thus extending the communications range for which the VCSEL is useful. Second, the operation of the VCSEL in multiple longitudinal modes is useful for applications that require the VCSEL to be mode-locked with a predetermined pulse repetition frequency. Examples of such applications include optical clock distribution in electronic circuits, quantum key distribution, and optical clock recovery in communications. Third, it is desirable to establish laser operations at wavelengths for which VCSEL devices are currently not available, due to constraints of VCSEL materials availability and/or materials quality.

Coupling of a VCSEL to an appropriate optical fiber to produce an extended cavity provides the design flexibility to address all of these enhanced applications, while maintaining the low cost structure that makes the VCSEL a compelling solution.

One particular embodiment of the invention is directed to a laser device comprising a vertical cavity, surface emitting laser (VCSEL) section that has at least a Bragg reflector a first gain region and an intracavity reflector formed over a substrate. An extended cavity section comprises an optical fiber having first and second ends, the first end of the optical fiber being optically coupled to the first gain region. The device also comprises an output coupler, a resonant cavity being formed between the Bragg reflector and the output coupler. The laser operates on a single longitudinal mode Another embodiment of the invention is directed to a device that includes a vertical cavity, surface emitting laser (VCSEL) section comprising at least a Bragg reflector and a first gain region formed over a substrate. An extended cavity section comprises a multiple transverse mode optical fiber having first and second ends and an associated pitch length. The first end of the optical fiber is optically coupled to the gain region. The device also has an output coupler coupled to the second end. A laser cavity is formed between the Bragg reflector and the output coupler.

Another embodiment of the invention is directed to a laser device that comprises a vertical cavity, surface emitting laser (VCSEL) section comprising at least a Bragg reflector and first and second gain regions formed over a substrate. An extended cavity section comprises a graded index optical fiber having first and second ends and an associated pitch length. The first end of the optical fiber is optically coupled to the first and second gain regions. The device also has an output coupler optically coupled to the second end of the optical fiber. First and second laser cavities, associated respectively with the first and second gain regions, are formed between the Bragg reflector and the output coupler.

Another embodiment of the invention is directed to a laser device that comprises a semiconductor laser having at least a high reflector and a gain region formed over a substrate. An optical fiber has first and second ends, and the first end of the optical fiber is optically coupled to the gain region. The optical fiber is doped with an excitable species manifesting optical gain when pumped with light at a pump wavelength generated by the semiconductor laser. The optical fiber is disposed within a fiber laser cavity formed between first and second fiber laser mirrors. A pump light reflector for reflecting light at the pump wavelength is coupled to the second end of the optical fiber.

The above summary of the present invention is not intended to describe each illustrated embodiment or every implementation of the present invention. The figures and the detailed description which follow more particularly exemplify different embodiments of this invention.

BRIEF DESCRIPTION OF THE DRAWINGS

The invention may be more completely understood in consideration of the following detailed description of various embodiments of the invention in connection with the accompanying drawings, in which.

Figure 1:
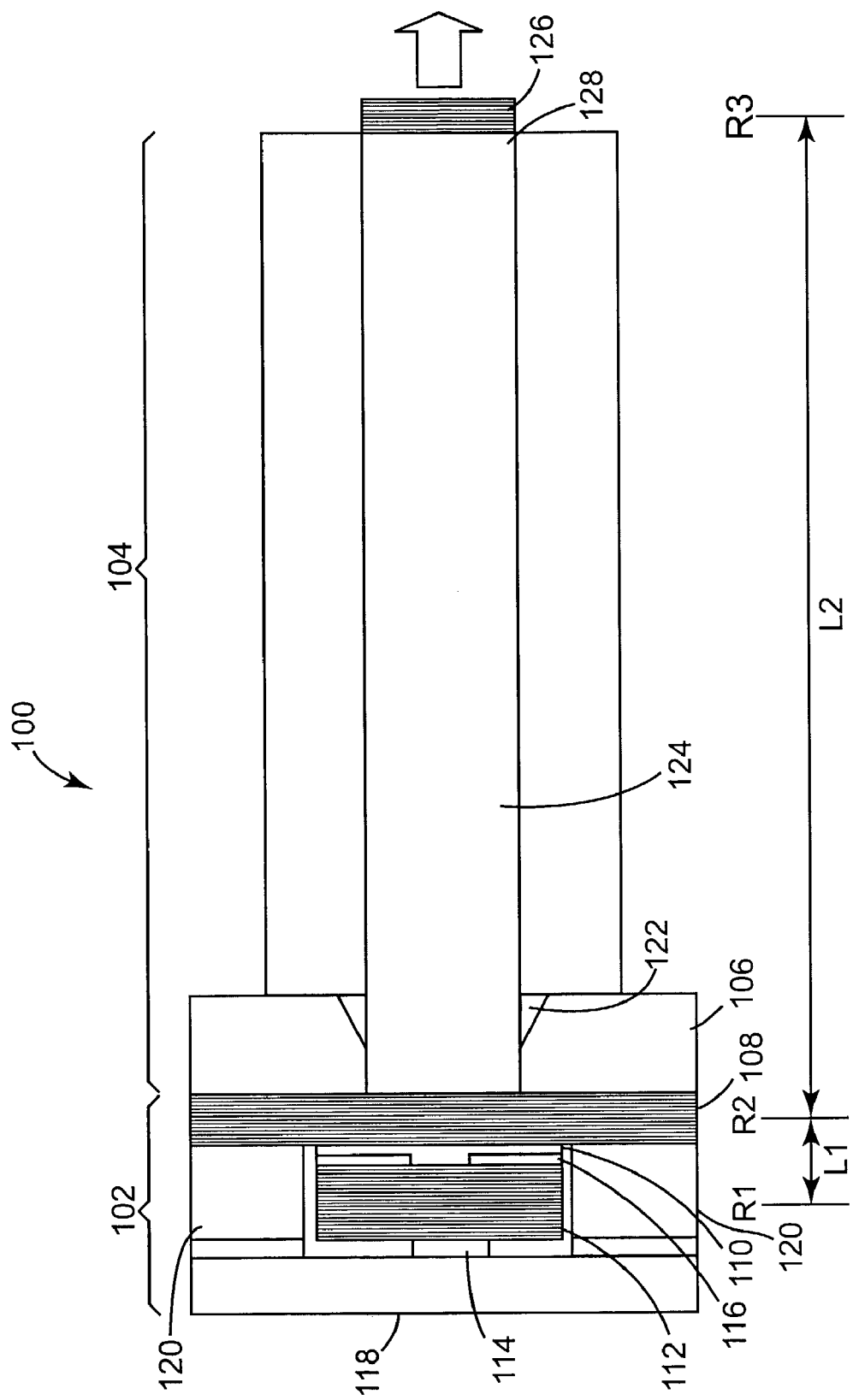
FIG. 1 schematically illustrates an embodiment of a fiber extended, vertical cavity, surface emitting laser (VCSEL) according to principles of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In general, the present invention is directed to an approach that increases the single transverse mode output power from a vertical cavity, surface-emitting laser (VCSEL), permits the VCSEL to operate in multiple longitudinal modes, thus permitting the VCSEL to be used in mode-locked applications, and permits the VCSEL to emit efficiently at previously unavailable wavelengths.

One particular embodiment of a fiber-extended VCSEL 100 according to the present invention is schematically illustrated in FIG. 1. The laser 100 comprises a vertical cavity portion 102 and an extended cavity portion 104. The vertical cavity portion 102 comprises a substrate 106 on which is formed a vertical cavity structure having an optional first mirror 108, a gain region 110, and a second mirror 112. The first mirror 108 is referred to hereafter as an intracavity reflector and the second mirror 112 is referred to as a high reflector. The intracavity reflector 108 and the high reflector 112 may be formed as semiconductor Bragg reflectors, and may be epitaxially grown. The gain region 110 may comprise a semiconductor gain layer, and may be, for example, a quantum well gain region. The gain region 110 may also be epitaxially grown. The types of semiconductor materials used in the gain region are typically selected to provide optical gain within a desired wavelength range. The types of materials used in the reflectors 108 and 112 are typically selected to provide desired amounts of reflectivity at the desired wavelength, with little or no optical absorption.

An electrode 114 may be formed over the high reflector 112 for passing electrical current through the gain region 110. An insulating current barrier 116 may be provided for lateral confinement of the current passing through the gain region 110. This may be used to define one or more specific transverse laser modes when the laser 100 oscillates. A heatsink 118 may be provided in thermal contact with the vertical cavity portion 102 to provide heat dissipation. The heatsink may be assisted by a thermoelectric cooler, not shown, for the purpose of temperature control. The thermal path between the active region 110, where the heat is generated in the vertical cavity portion 102, and the cooling unit 118 may be through the high reflector 112 and the electrode 114, or through the intracavity reflector 108 and the lateral conducting portions 120.

The substrate 106 may be provided with an aperture 122. A waveguiding element, such as a fiber 124, is optically coupled to receive light passing through the intracavity reflector 108 from the gain region 110. The fiber 124 may be attached to the substrate 106. A reflector 126 is coupled to the other end 128 of the fiber 124 from the substrate 106. The reflector 126, referred to hereafter as the output coupler, may be a multilayer dielectric mirror deposited on the fiber end 128. The reflectors 108, 112 and 126 are typically reflective at the desired wavelength of laser operation.

The reflectivity of the intracavity reflector 108 may be within a range of values, for example $R_2$=50%–99%, although the reflectivity may also be outside this range. The combined reflectivity of the intracavity reflector 108 and the output coupler 126 may be equivalent to the optimized output coupler for an equivalent conventional VCSEL having no extended cavity. This optimized reflectivity is typically in the range from 99% to 99.7% for an optimized VCSEL, although the value may fall outside of this range for some applications.

When a given desired optimal reflectivity, $R_{eff}$, is to be achieved based on selected values of the reflectivity, $R_2$, of the intracavity reflector 108 and the reflectivity, $R_3$, of the output coupler 126, a relationship between the three reflectivity values may be derived as follows:

$$r_{eff}=(r2\pm r3)/(1\pm r2 r3) \ (r2+r3)/(1+r2 r3) \ (2 r2)/(1+(r2)^2)=(2 r3)/(1+(r3)^2)$$

where: $R_{eff}=r_{eff}^2$; $R2=(r2)^2$; $R3=(r3)^2$

In these expressions, $R_{eff}$, $R2$, and $R3$ denote reflection magnitudes while $r_{eff}$, $r2$ and $r3$ denote reflectivity amplitudes. In this expression, the effective reflectivity depends on whether or not the cavity length L2 is adjusted such that R2 and R3 are in phase or out of phase. For in phase adjustment, the + sign applies. For but of phase adjustment, the—sign applies. It is most typically the case that the cavity length is adjusted such that the two reflectivities are in phase. For this case, we can eliminate the minus sign, leading to the second expression following the equals sign. In addition, it is determined that when the desired result is increased single mode stability without modelocking, the optimal range is such that R2 is approximately equal to R3. R3 may be higher than or equal to R2. The third expression following the equals sign shows the relation for the case where R2 is equal to R3.

For the case of modelocking the VCSEL, a range for R2 is approximately $0 \leq R2 < R3$, and more preferably $0 \leq R2 < R3/3$. Combining either of these relationships between R2 and R3 with a desired value of $r_{eff}$ allows the values for R2 and R3 to be specified unambiguously.

It will be appreciated that where the reflectivity of the intracavity reflector 108 is to be set to zero, then the intracavity reflector 108 may be omitted.

The extended cavity length introduced by the optical fiber 124 has a significant effect on the modal properties of the VCSEL 100. Firstly, the numerical aperture (NA) of the fiber may be selected so that higher order transverse modes arising in the cavity between the high reflector 112 and the intracavity reflector 108 experience reduced coupling efficiency into the fiber 124 relative to the fundamental mode or lower order modes. The reduced coupling into the fiber 124 results in reduced feedback for these higher order modes by way of the output coupler 126, thereby resulting in the suppression of laser oscillation on higher order transverse modes. Consequently, the laser 100 emits more power into the fundamental transverse mode. This increases the ability of the light beam emitted from the laser 100 to be focused into a diffraction limited spot and thereby coupled into other optical systems such as a single mode optical fiber.

The relative selectivity of the fundamental and higher order modes may also be adjusted simply by changing the cavity length L for a fiber of a given numerical aperture. This is the case because, particularly in graded index fiber, the optimal modal reflectivity for a mode of a given width is dependent upon the length of the fiber.

Secondly, the extended length of the cavity may introduce additional longitudinal modes. The reflectivity of the high reflector 112 is taken as R1, that of the intracavity reflector 108 is R2 and that of the output coupler 126 is taken as R3. In the limit of R2=0, the laser 100 oscillates on the Fabry-Perot modes of the cavity formed between the high reflector 112 and the output coupler 126. These Fabry-Perot modes span the gain bandwidth of the gain region 110. Considering now the situation where R2 becomes higher and R3 is gradually reduced correspondingly to maintain constant net cavity reflectivity, $r_{eff}$, the wavelength span and the number of oscillating Fabry-Perot modes decreases. This is compounded by the fact that, as the external cavity length, L, is reduced, the spacing between the modes of the cavity increases, resulting in fewer modes that lie within a given cavity spectral bandwidth. Accordingly, for a fiber of a given length, the laser may operate on multiple longitudinal modes when R2 is zero, but operate on a single longitudinal mode when R2 reaches a sufficiently high non-zero value. Operation is defined to be on a single longitudinal mode when the amplitude of any one particular longitudinal mode exceeds the amplitude of each and every other longitudinal mode by at least 15 dB. The particular value of R2 at which single longitudinal mode operation is obtained depends on the relative values of R1, R2 and R3, the magnitude of the internal cavity losses, the external cavity length, L, and on the level of gain in the gain region 110. It is generally the case, however, that single mode behavior is achieved when R2~R3 for values of L on the order of 1 cm.

Where the laser 100 is to be used in a mode-locked manner, a broad spectral bandwidth typically corresponds to shorter mode-locked pulses. The spectral bandwidth of the fiber cavity is maximum when R2=0 and when R3 is high, for example approaching 100%. However, there are typically some propagation and/or diffraction losses incurred in placing the mirror 126 at R3. These losses include the reflective loss of the output coupler 126 and coupling losses between the fiber 124 and the vertical cavity portion 102. Since VCSEL devices have only a small gain per pass, typically on the order of 0.5%, the VCSEL laser 102 may be negatively impacted if the aforementioned losses are on the order of only a few tenths of a percent. The greater the contribution of R2 to the total reflectivity, the less sensitive is the cavity to the losses in the fiber cavity. Thus, for a given level of loss in the fiber cavity, there is a corresponding minimum value of R2 for which those losses have a negligible impact on the performance of the laser, There is, therefore, a lower bound placed on R2, and a corresponding upper bound on the spectral bandwidth, determined by the losses associated with the external cavity. Hence, lower losses lead to a broader laser bandwidth, resulting in shorter laser pulses.

Figure 2:
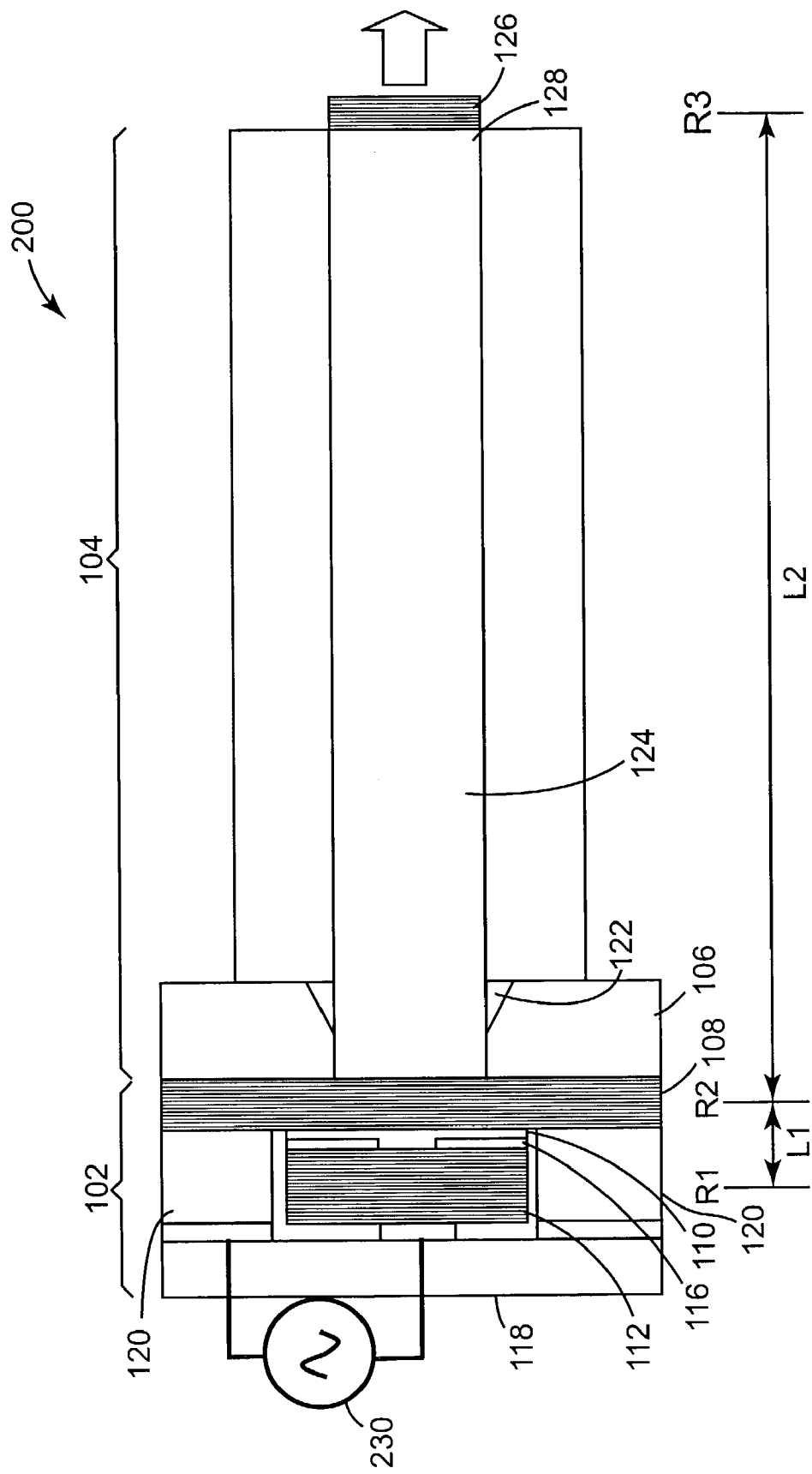
FIG. 2 schematically illustrates an embodiment of a mode-locked, fiber extended VCSEL, according to principles of the present invention.

In one particular embodiment, illustrated schematically in FIG. 2, the laser 200 may be actively mode-locked by applying a modulated current to the VCSEL section 102 via a modulated current generator 230. Active mode-locking generally provides less noise than passively mode-locked systems. The laser 200 may, however, be passively mode-locked, for example using a quantum well saturable absorber, or hybrid mode-locked, using both external modulation and a saturable absorber. Active mode-locking may occur at a frequency corresponding to the cavity roundtrip time, or at a harmonic or subharmonic of that frequency.

The modulated current generator 230 injects a current signal having a component at the desired clock frequency, which corresponds to a multiple of the cavity round trip time. The current supplied by the current generator 230 typically includes a DC bias portion and an AC modulation portion. The frequency of the AC modulation is related to the round-trip time of the laser cavity formed between the high reflector 112 and the output coupler 126.

Figure 3:
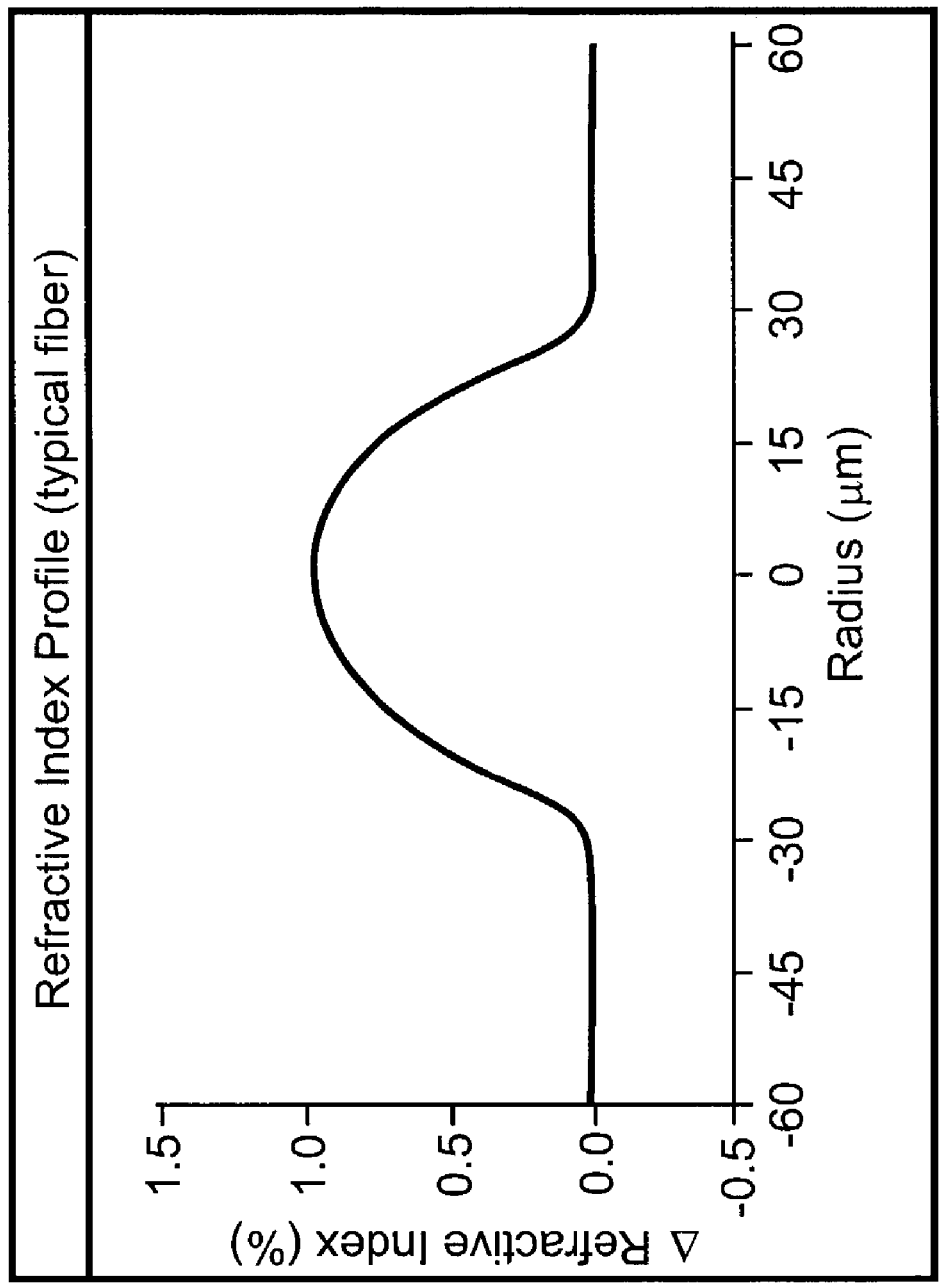
FIG. 3 present a graph of refractive index plotted against radial position for a graded index optical fiber.

The optical fiber 124 may be a fiber that supports the propagation of multiple modes of light. One example of such a fiber is a gradient index fiber. Another example is a multi-mode, step index fiber. In particular, the Corning Infinicor SX+gradient index fiber has properties that are particularly well suited to fiber coupled cavity design. These properties include: low optical loss and a well optimized refractive index profile as a function of radius from the fiber axis, which closely approximates an ideal secant profile over a significant radius. FIG. 3 shows a refractive index profile for this type of fiber. From the refractive index profile, several other key parameters of the fiber may be extracted. The refractive index profile indicates that the peak refractive index on the fiber axis is 1% greater than the cladding index. The effective refractive index for the fiber modes is approximately 1.490. The fiber has a core diameter of about 50 µm, and so the grading parameter, g, for this particular fiber may be determined to be 5.63 mm$^{-1}$. The value of the refractive index, n(r), of the graded fiber core varies radially with position, r, from the core axis, according to the following expression:

$$n(r) = n_0 \, \text{sech}(gr) \, n_0 \, [1 - \tfrac{1}{2} g^2 r^2]$$

where $n_0$ is the refractive index of the core on the core axis. This relatively high value for the grading parameter results in a short value for the pitch (P) parameter of 1.12 mm, since the pitch is related to the grading parameter through the expression $P = 2\pi/g$.

The properties of the Corning Infinicor SX+fiber are summarized in Table I, below.

TABLE I

Properties of Corning Infinicor SX+ Optical Fiber

| Property | Symbol | Value |
| --- | --- | --- |
| Maximum refractive index | $n_0$ | 1.49 |
| Cladding refractive index | $n_c$ | 1.4752 |
| grading parameter (mm$^{-1}$) | g | 5.6288 |
| pitch (mm) | P | 1.1163 |
|  | P/2 | 0.5581 |
|  | P/4 | 0.2791 |
| numerical aperture | N.A. | 0.2092 |

TABLE I-continued

Properties of Corning Infinicor SX+ Optical Fiber

| Property | Symbol | Value |
| --- | --- | --- |
| acceptance cone angle (degrees) | θ | 12.07 |
| Gaussian width @ 850 nm (microns) | W1 | 6.29 |
| Gaussian width @ 1550 nm (microns) | W1 | 8.50 | where the numerical aperture, N.A. is given by the expression:

$$(N.A.)^2 = (n_0)^2 - (n_c)^2,$$

and the gaussian beam width, W1 is given by the expression $$(W1)^2 = \lambda/(\pi g(n_c)^{1/2}),$$

and λ is the wavelength of the light.

The grading parameter, g, may be calculated from the expression:

$$g = (2(n_0 - n_c)/n_0)^{1/2}/r_0$$

where $r_0$ is the radial distance form the center of the core at which the parabolic approximation to the refractive index profile extrapolates to the cladding index. For the Infinicor SX+fiber, the value of $r_0$ is about 25 μm.

A graded index fiber generally supports multiple transverse mode operation. The fundamental transverse mode of the fiber is, due to the approximately parabolic index profile, a Gaussian beam of constant width as a function of distance down the fiber. The Gaussian beam widths, W1, are indicated in Table I for the Corning Infinicor fiber at the wavelengths of 850 nm and 1550 nm. If the fiber is illuminated with a beam of this Gaussian width, the beam couples into the lowest order mode of the fiber and propagates at this width unchanged as a function of distance in the fiber.

The multimode fiber also supports higher order transverse modes, and these modes become relevant when the fiber is illuminated with a beam that is not matched to the fundamental Gaussian beam width. These higher order modes take the form of an orthogonal set of Laguerre-Gaussian or Hermite-Gaussian modes. For an arbitrary incident modal width, the incident beam can be decomposed into a superposition of these modes, each with its own propagating characteristics. For the case of the parabolic or near parabolic index profile, the propagation constants of these modes differ from the propagation constant of the fundamental mode by integer multiples of the pitch, P, such that the overall field distribution in the fiber, for arbitrary illuminations, replicates itself at every interval of the pitch of the fiber.

The use of a graded index fiber results in the ability to exploit additional design parameters. Due to the nature of graded index fiber, light propagates along the fiber in a periodic manner according to the previously mentioned pitch parameter P. In general, a centrosymmetric, circular beam propagates within a graded index fiber with a sinusoidally varying beam width, centered around the characteristic beam width of the fiber, W1. At the ¼ pitch point in the fiber, the beam width is transformed from one extreme in width to the other. In other words, a beam that is launched into the fiber having a width smaller than the characteristic width, W1, reaches its maximum width at the ¼ pitch point.

Likewise, a beam that is launched into the fiber having a width larger than the characteristic width, W1, reaches its minimum width at the ¼ pitch point. For the extreme case of point source illumination, the beam at the ¼ pitch point is a collimated plane wave.

There are several differences between the use of a multimode fiber, such as a graded index fiber, and a step single mode fiber for extending a mode-locked VCSEL cavity. A step, single mode fiber has a small core diameter, and so highly efficient coupling into the single mode fiber requires a complicated and difficult alignment procedure. Furthermore, even when the alignment to the single-mode fiber is optimized, there are still significant coupling losses since the fiber is a step index fiber. The reflectivity of the intracavity reflector R2 needs to be fairly high, therefore, to obtain a high net reflectivity to allow the laser to oscillate. The relatively high, intracavity reflectivity, however, narrows the effective spectral bandwidth of the laser, thus imposing an undesirable lower limit on the length of the pulses the mode-locked laser provides when single mode fiber is used.

In contrast, the alignment of a multi-mode fiber, such as a graded index fiber, is not as critical, and so it is easier to manufacture the laser that has a graded index fiber. Furthermore, coupling losses to the graded index fiber are considerably less than with the single mode fiber. This permits the intracavity reflectivity to be reduced relative to the single-mode fiber case, which results in a broader effective bandwidth, which leads to shorter mode-locked pulses.

It was stated above that, in the mode-locking regime, the value of R2 may be equal to or less than R3, and may preferably be less than or equal to R3/3. An effective value of R3, $R3_{eff}$, represents the round-trip losses in the extended fiber section 104, taking into account coupling losses as well as the reflective loss of the output coupler 126. Thus, if the one-way coupling loss is L, in other words L represents the fraction of light coupled from the VCSEL section 102 into the fiber section 104, then $R3_{eff}$ is given by $R3_{eff} = L^2 R3$. However, in order to provide sufficient net reflectivity for laser operation, $R3_{eff}$ must be high, approaching 1. However, an intrinsic upper bound on $R3_{eff}$ is $R3_{eff} = L^2$, when R3=1. If L is high, then R2 needs to be maintained very high to achieve laser operation. However, in order to maintain shorter mode-locked pulses, it is preferable for the value of R2 to be less than $R3_{eff}$. Thus, the lower coupling losses enabled by multimode, as opposed to single mode, fiber, advantageously facilitate the achievement of short mode-locked pulses.

The fiber 124 may be characterized by stating its length compared to a fraction of a full pitch. The operation of an extended cavity VCSEL having different lengths of graded index fiber 124 is now described with reference to FIGS. 4A–4D.

Figure 4A:
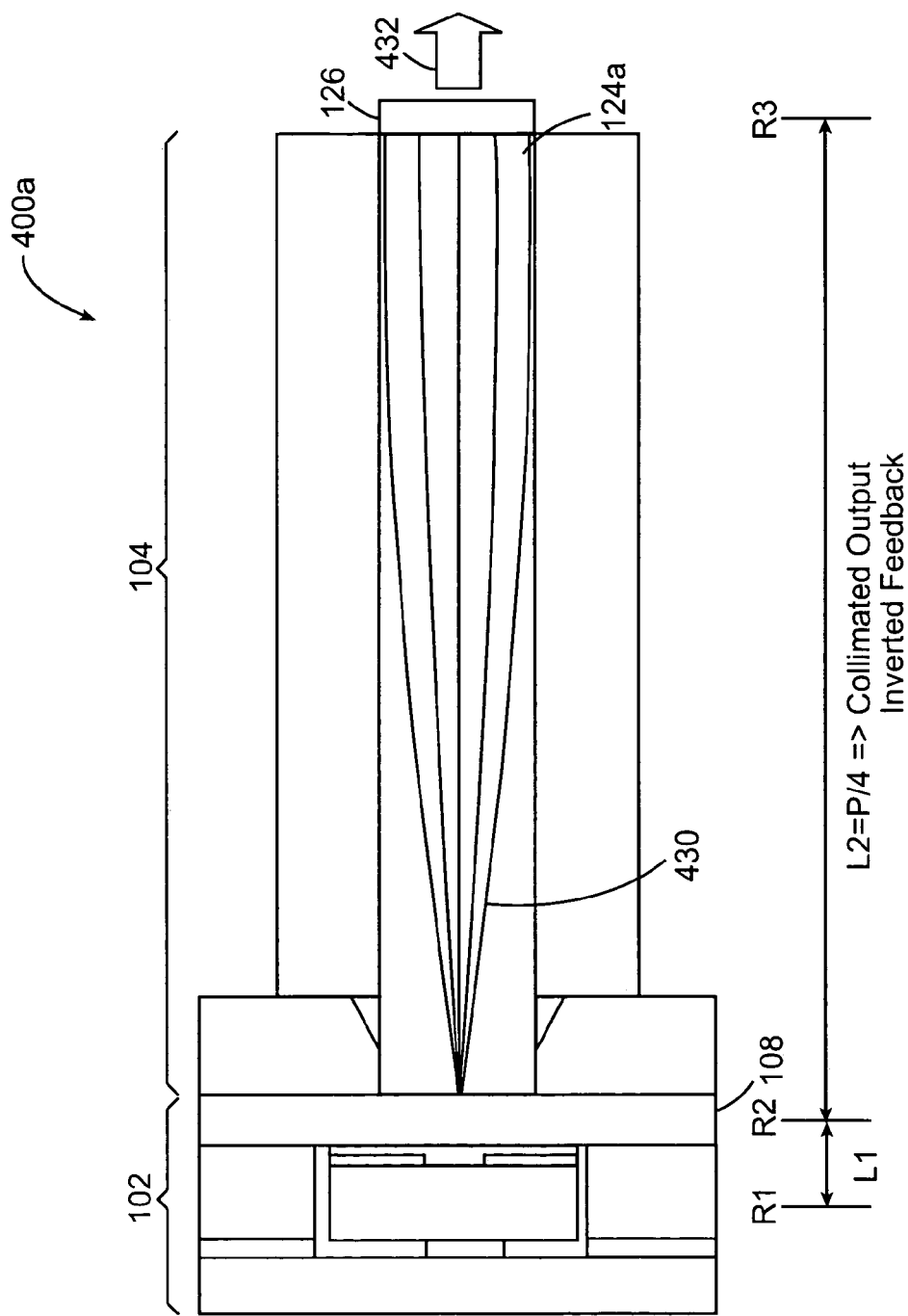
FIG. 4A schematically illustrates an embodiment of a fiber extended, VCSEL having a graded fiber having a length of one quarter the fiber pitch, according to principles of the present invention.
Figure 4B:
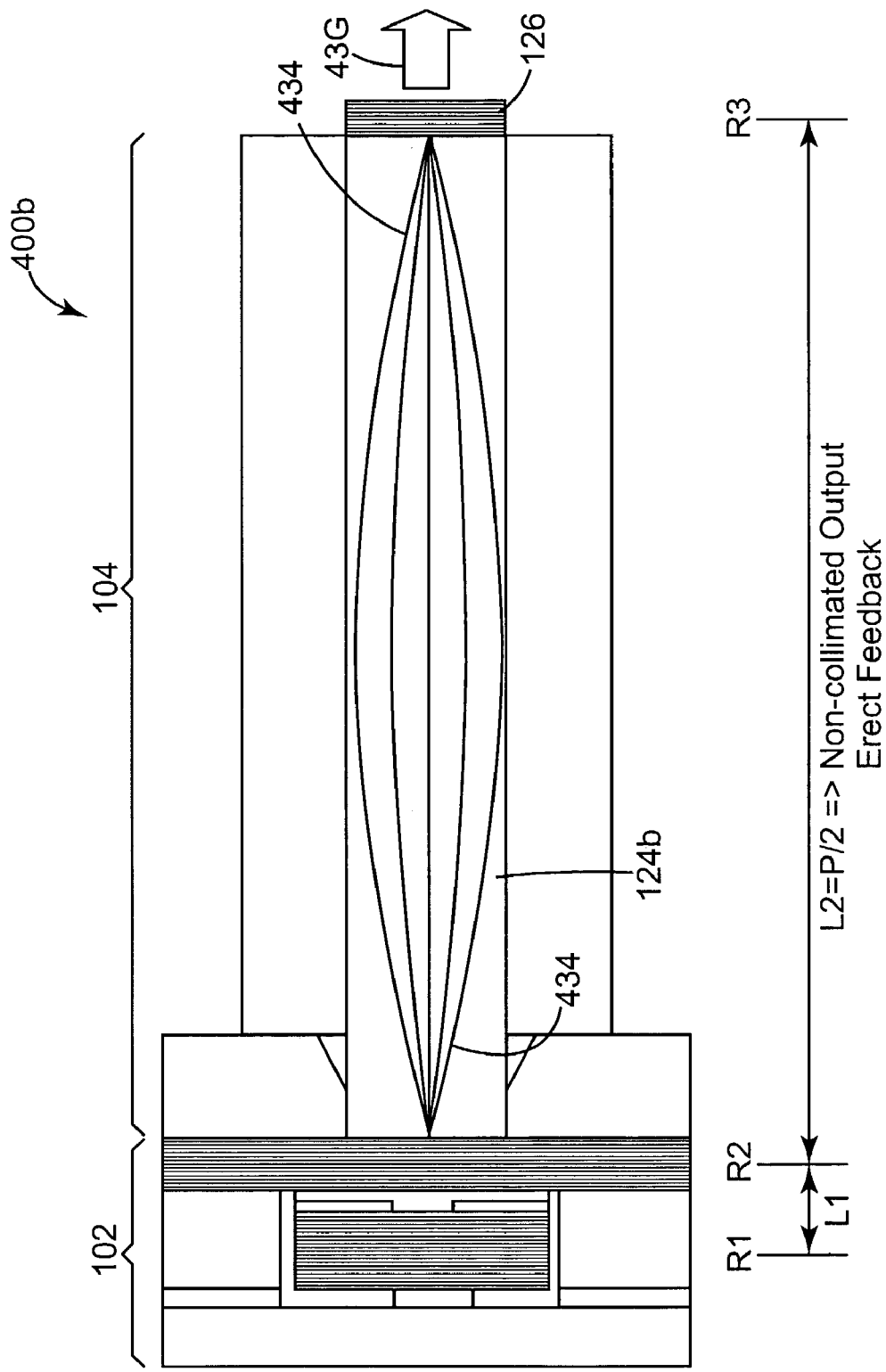
FIG. 4B schematically illustrates an embodiment of a fiber extended, VCSEL having a graded fiber having a length of one half the fiber pitch, according to principles of the present invention.
Figure 4C:
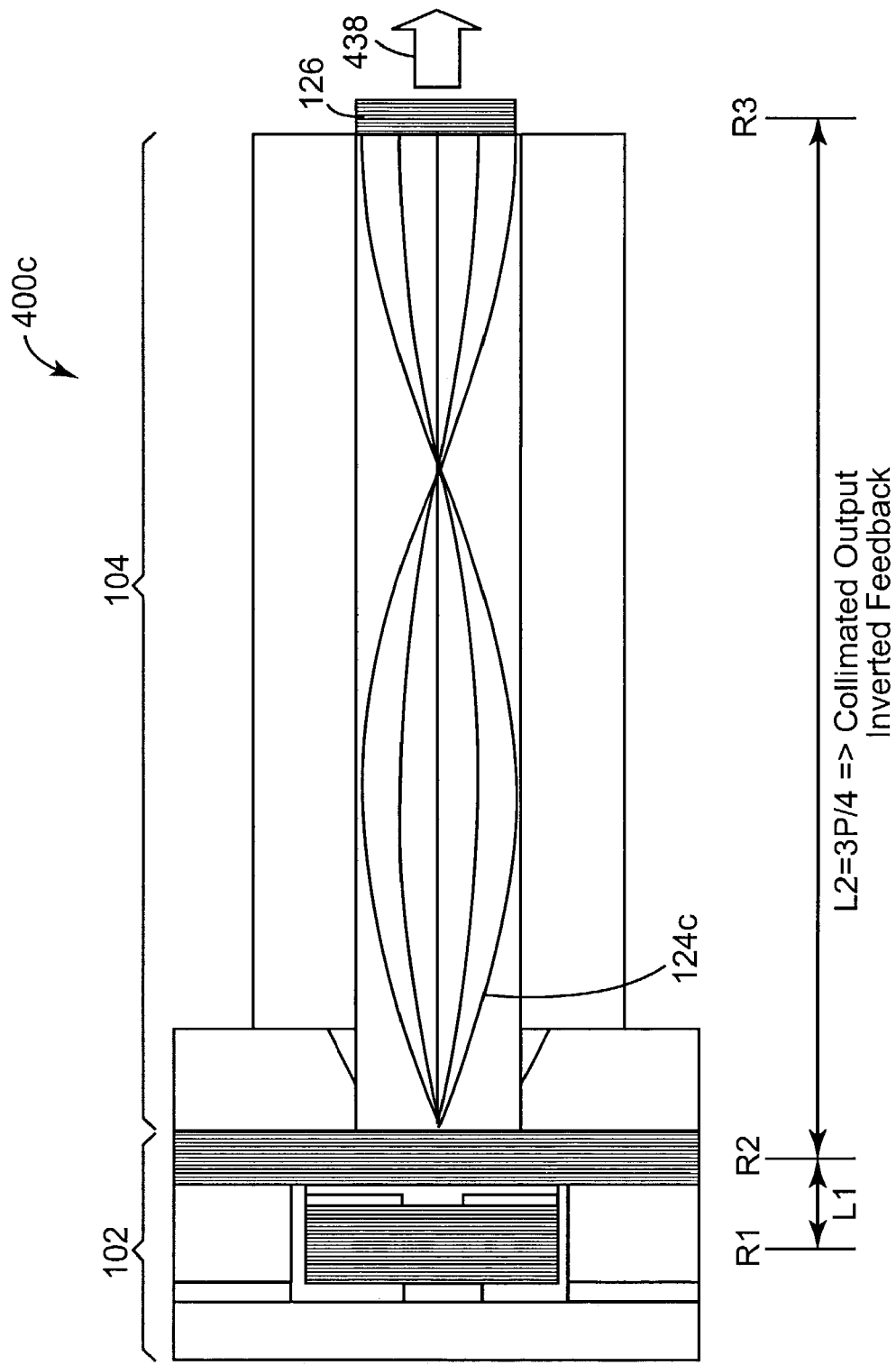
FIG. 4C schematically illustrates an embodiment of a fiber extended, VCSEL having a graded fiber having a length of three quarters of the fiber pitch, according to principles of the present invention.

In the embodiment schematically illustrated in FIG. 4A, the fiber 124a has a quarter pitch length. If we assume the illuminating source is substantially smaller than the characteristic width w1, the light beam 430 within the fiber portion 104 is substantially collimated at the output coupler 126, and so the light 432 output from the laser 400a is substantially collimated. This simplifies the beam handling optics outside of the laser 400a. However, on one round trip from the intracavity reflector 108 to the output coupler 126 and back to the intracavity reflector 108, the beam 430 is inverted. In the embodiment of laser 400b schematically illustrated in FIG. 4B, the fiber 124b has a length of one half of a pitch. Accordingly, the beam 434 at the output coupler 126 is not collimated, but is inverse imaged at the output coupler 126. On the other hand, the beam returning to the VCSEL portion 102 from the output coupler 126 is not inverted, but is upright. Thus, the light 436 that emerges from the VCSEL portion 102 and is reflected within the fiber 124b is imaged erectly back on itself. In the embodiment of laser 400c schematically illustrated in FIG. 4C, the fiber 124c has a length of three quarters of a pitch. This operates like the cavity illustrated in FIG. 4A, i.e., the light 438 that emerges from the output coupler 126 is substantially collimated. On the other hand, the light from the VCSEL section 102 is returned to the VCSEL section 102 from the output coupler 126 inverted. It will be appreciated that other cavity lengths that are odd integer multiples of a quarter pitch length may be used.

Figure 4D:
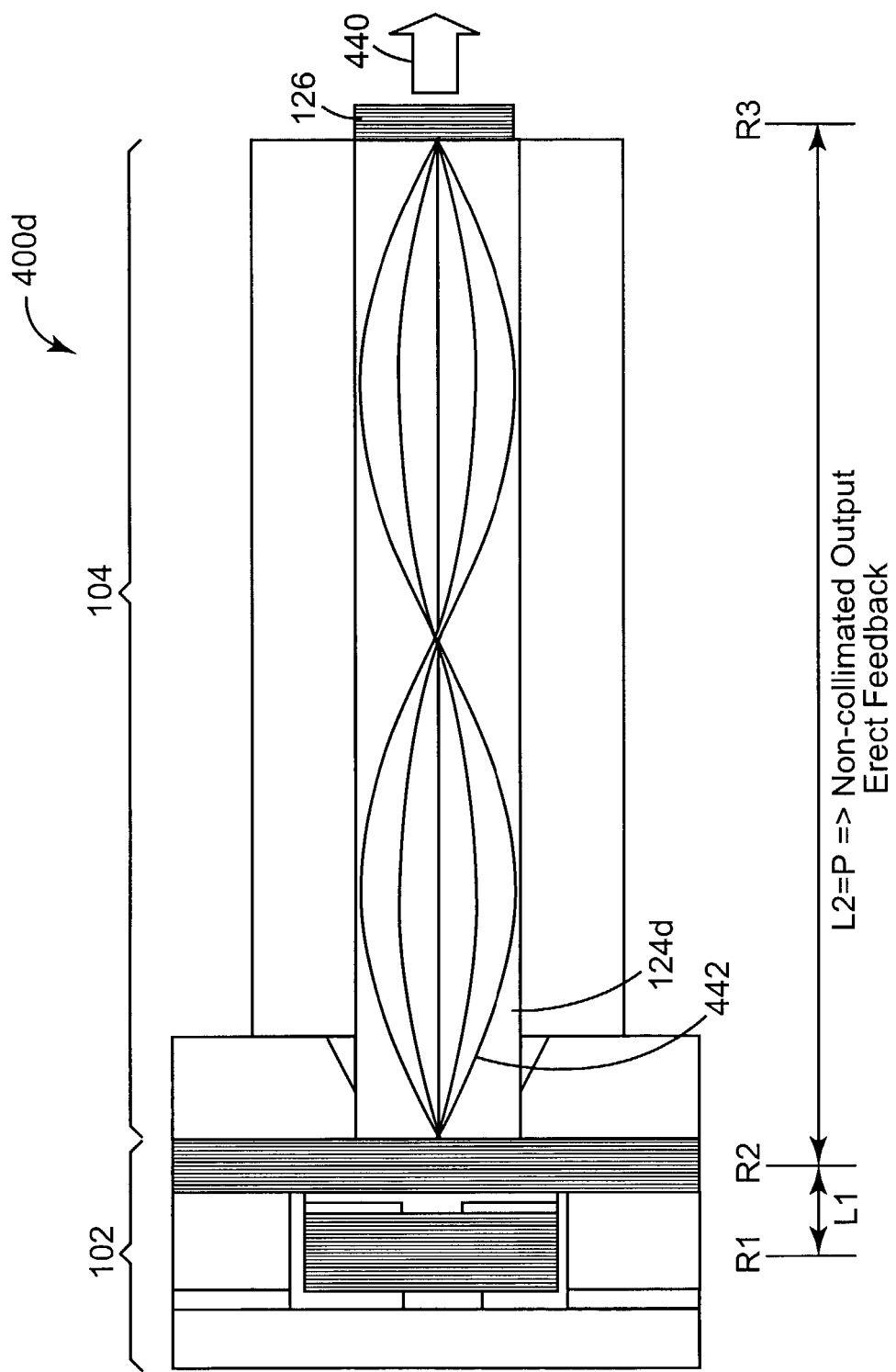
FIG. 4D schematically illustrates an embodiment of a fiber extended, VCSEL having a graded fiber having a length of one fiber pitch, according to principles of the present invention.

In the embodiment of laser 400d schematically illustrated in FIG. 4D, the fiber 124d has a length of a full pitch. This operates like the cavity illustrated in FIG. 4B, in other words, the 440 light emerges from the output coupler 126 either diverging or converging, since the light 442 within the fiber 126d is brought substantially to a focus at the output collimator 126. On the other hand, the light is not inverted when it returns to the VCSEL portion 102 from the output coupler 126. It will be appreciated that other cavity lengths that are even integer multiples of a quarter pitch length may be used.

Figure 5:
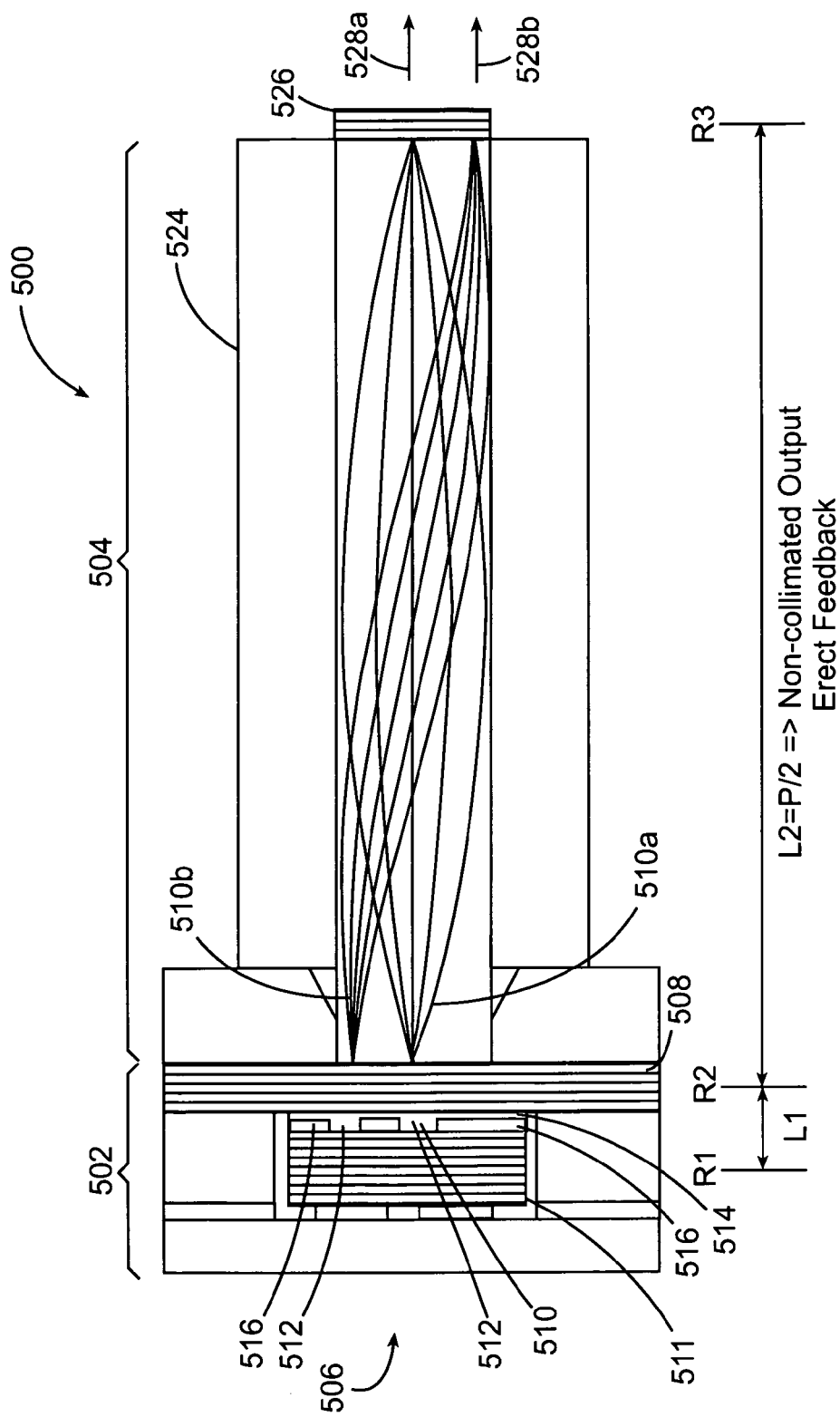
FIG. 5 schematically illustrates an embodiment of a multiple element, extended cavity VCSEL according to principles of the present invention.

FIG. 5 schematically illustrates an embodiment 500 of a multiple laser device according to principles of the present invention. The laser 500 includes a VCSEL section 502 and an extended cavity section 504. An array 506 of multiple VCSEL light sources is placed in a cavity formed between a high reflector 511 and an output coupler 526. The output coupler 526 may be formed on the end of a graded fiber 524. In the illustrated embodiment, the fiber 524 has a length that is about equal to an even number of quarter pitches. An intracavity reflector 508 may be disposed in the VCSEL section, between the gain region 510 and the fiber 524. The gain region 510 comprises a semiconductor gain layer 514 having multiple emitters defined by current confining structures 516.

In such a cavity, light 510a and 510b from each emitter 512 is imaged back on to itself after a round trip through the cavity. Thus, the output coupler 526 serves as an output coupler for multiple light sources 504 in the array 502, with minimal cross coupling. Although a two-element array is illustrated, it will be appreciated that multiple element laser device array having a different number of laser emitters may be used. The laser emitters may be formed in a linear array, or may be formed in a two-dimensional array.

The outputs 528a and 528b from the laser 500 may be separated or combined once outside the laser 500.

It will be appreciated that, where the VCSEL is mode-locked, the desired mode-locking frequency and the desired pitch are important parameters. For a given refractive index grading parameter value and cavity design type, there exists a set of cavity frequencies that may be accessed.

For example, if the Corning Infinicor fiber discussed above were used in a laser producing a collimated output, the available fiber lengths are as listed in Table II, where the zero order is the quarter pitch cavity. Table II lists the order of the fiber pitch, the length of the fiber and the mode-locking frequency. Higher order cavities add successive P/2 lengths to the cavity length. Mode-locking frequency values different from those listed may be achieved using a fiber with a different grading parameter, or by using a graded fiber that does not produce a collimated output. In other words, different mode-locking frequencies may be accessed where the cavity length is not an odd integer multiple of quarter pitch lengths. A combination of using either non-collimated outputs or different grading parameters provides the ability to design the laser to emit at other desired mode-locking frequencies.

TABLE II

Mode-locked Cavity Characteristics Using Corning Fiber with Odd Integer Multiple of Quarter Pitch Length

| Pitch Order | Fiber length (mm) | Mode-Locking frequency (GHz) |
|---|---|---|
| 0 | 0.28 | 539.22 |
| 1 | 0.84 | 179.78 |
| 2 | 1.40 | 107.89 |
| 3 | 1.95 | 77.15 |
| 4 | 2.51 | 60.01 |
| 5 | 3.07 | 48.99 |
| 6 | 3.63 | 41.52 |
| 7 | 4.19 | 36.01 |
| 8 | 4.74 | 31.72 |
| 9 | 5.30 | 28.41 |
| 10 | 5.86 | 25.72 |
| 11 | 6.42 | 23.39 |
| 12 | 6.98 | 21.55 |
| 13 | 7.53 | 19.96 |
| 14 | 8.09 | 18.49 |
| 15 | 8.65 | 17.39 |
| 16 | 9.21 | 16.29 |
| 17 | 9.77 | 15.43 |
| 18 | 10.32 | 14.57 |
| 19 | 10.88 | 13.84 |
| 20 | 11.44 | 13.10 |
| 21 | 12.00 | 12.49 |
| 22 | 12.56 | 11.99 |
| 23 | 13.11 | 11.48 |
| 24 | 13.67 | 11.01 |
| 25 | 14.23 | 10.57 |
| 26 | 14.79 | 10.18 |
| 27 | 15.35 | 9.81 |
| 28 | 15.91 | 9.47 |
| 29 | 16.46 | 9.14 |
| 30 | 17.02 | 8.83 |

In summary, the laser of the present invention includes a VCSEL structure coupled to a section of optical fiber. The optical fiber section may be short enough to allow the longitudinal modes of the resulting laser cavity to be separated by greater than 2 GHz. With appropriate selection of the reflectivities of the mirrors in the laser, an increased power single mode laser, and/or a high frequency mode-locked laser, may be achieved.

Compactness and simplicity are some of the advantages of VCSELs that make it desirable to extend the VCSEL technology to additional wavelengths. A VCSEL itself may be operated at many wavelengths, dependent on the energy gap of the particular semiconductor material used in the gain region. However, semiconductor materials producing optical gain in the wavelength ranges 1800–2500 nm and 350–600 nm are not yet available for VCSEL fabrication.

One approach to extending semiconductor laser technology to different wavelength ranges is to pump a fiber laser using a semiconductor laser. This way, a semiconductor laser may be operated at a wavelength that is more easily achieved in the semiconductor gain region, and the light used to pump an optical fiber that contains an excitable species. Examples of excitable species include rare earth ions, such as erbium, thulium, ytterbium, holmium, neodymium, promethium, terbium, praseodymium and the like. Fibers doped with the excitable species may be used in amplifiers or lasers by optically pumping them at an appropriate absorption wavelength and then providing optical feedback for regenerative amplification at a selected emission wavelength appropriate to the gain wavelength of the dopant species.

Optical fiber lasers are typically pumped with pump light that is coupled into the fiber using one or more optical lenses. This approach leads to coupling losses as well as to a total package size that is unwieldy and not amenable to package size reduction. Semiconductor technology may be used to fabricate a laser operating at many of the pump wavelengths associated with doped fiber amplifiers or lasers, and can be used to efficiently pump a compact fiber laser.

In addition, many fiber laser applications call for a fiber length ranging from roughly 0.5 meter to several meters or more. This is typically driven by the need to provide sufficient path length within the fiber for substantially complete absorption of the laser pump power. These lengths of fiber are, however, problematic for the realization of compact light sources. In the best case, the fiber is coiled, with a minimum coil diameter on the order of 7.5 cm, to reduce excess losses, resulting in minimum package dimensions of roughly 7.5 cm×7.5 cm×1 cm. Here, a method is disclosed for realizing resonant enhanced absorption of the pump light, enabling substantially shorter sections of fiber, on the order of 1 cm. This fiber is sufficiently short that coiling the fiber is unnecessary, and a short straight segment of fiber is compatible with total packages on the order of 0.5 cm×0.5 cm×1.5 cm in dimensions, thus dramatically reducing the volume occupied by the laser component.

Figure 6:
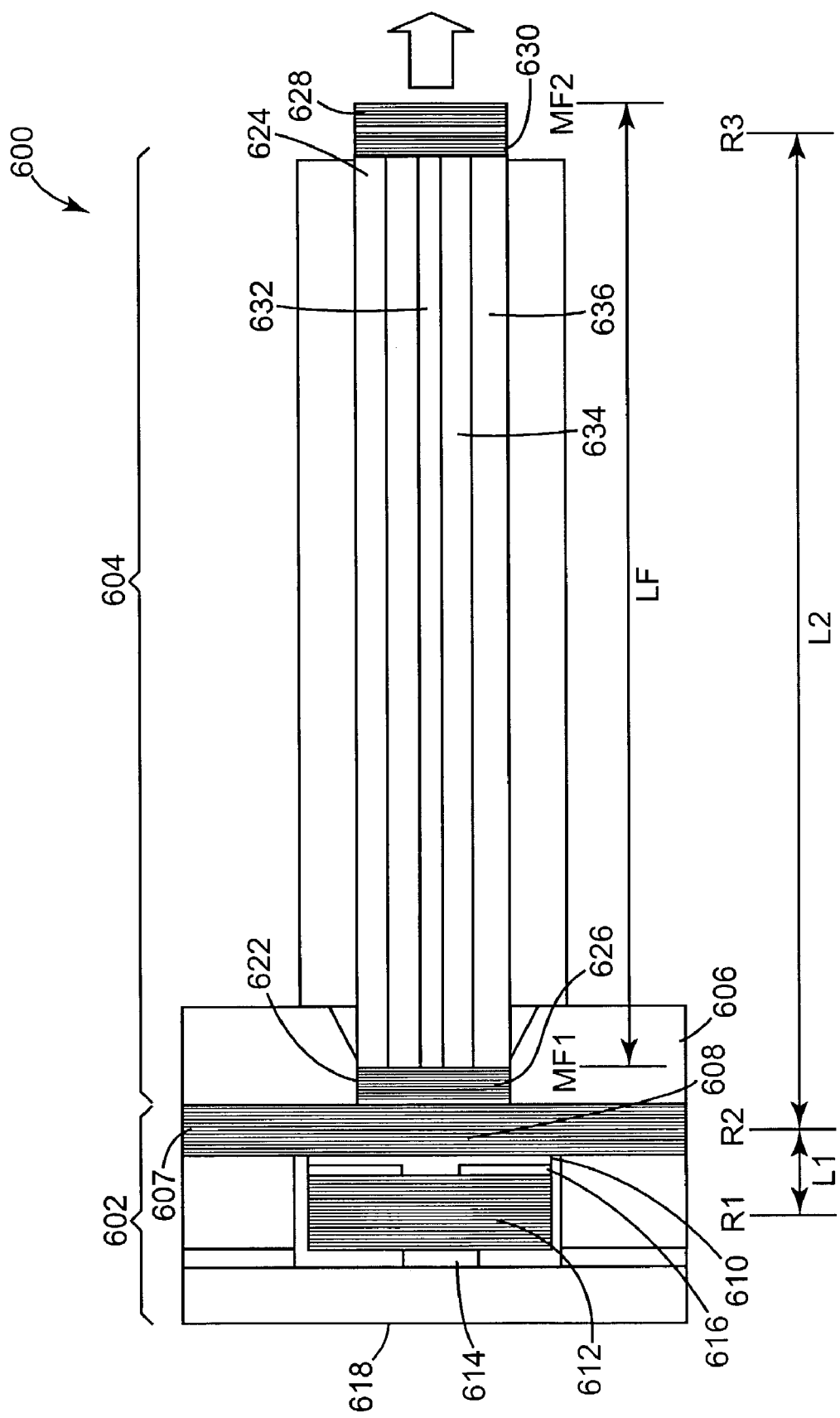
FIG. 6 schematically illustrates an embodiment of a VCSEL-pumped fiber laser according to principles of the present invention.

One embodiment of a semiconductor laser-pumped fiber laser 600 is schematically illustrated in FIG. 6. In the illustrated embodiment, the semiconductor laser is a VCSEL, but it will be appreciated that the principles discussed herein may also be applied to an edge emitting semiconductor laser. The laser 600 includes a VCSEL portion 602 and a fiber portion 604. The VCSEL portion 602 comprises substrate 606 on which is formed a vertical cavity structure 607 having an optional VCSEL output coupler 608, a gain region 610, and a Bragg high reflector 612. The Bragg reflector 612 and VCSEL output coupler 608 may be formed as semiconductor Bragg reflectors, and may be epitaxially grown over the substrate 606. The gain region 610 may comprise a semiconductor gain layer, and may be, for example, a quantum well gain region. The gain region 610 may also be epitaxially grown. The types of semiconductor materials used in the gain region are typically selected so that the VCSEL oscillates at a desired wavelength for pumping the fiber portion 604. The types of materials used in the reflectors 608 and 612 are typically selected to provide desired amounts of reflectivity at the desired wavelength, with little or no optical absorption.

An electrode 614 may be formed over the Bragg high reflector 612 for passing electrical current through the gain region 610. An insulating current barrier 616 may be provided for lateral confinement of the current passing through the gain region 610. A heatsink 618 may be provided in thermal contact with the vertical cavity portion 602 to provide heat dissipation.

The substrate 606 is provided with an aperture 622. A first end of the fiber 624 is optically coupled to receive light passing from the gain region 610. The fiber 624 may be attached to the substrate 606, and may be inserted, at least part way, into the aperture 622.

A first fiber reflector 626 is disposed at the first end of the fiber 624 and a second fiber reflector 628 is disposed at the second end of the fiber 624. The fiber reflectors 626 and 628 form a fiber cavity. Typically, the first fiber reflector 626 is a high reflector at the operating wavelength of the fiber laser 604. The first fiber reflector 626 may have a low reflectivity at the pump wavelength so that a large fraction of the pump light from the VCSEL section 602 passes through the first fiber reflector 626 into the fiber 624.

The first fiber reflector 626 may be a multiple layer dielectric mirror deposited on the end of the fiber 624, or may be separate from the fiber 624. In one embodiment (not shown) the first fiber reflector 626 is an epitaxially grown Bragg reflector on the substrate 606, between the gain region 610 and the fiber 624.

The second fiber reflector 628 typically has a reflectivity less than 100% and operates as the output coupler for the fiber laser. The value of the reflectivity of the second fiber reflector 628 may be selected for optimum output coupling, based on a number of system parameters such as the fiber length, pump power, doping level, core diameter, and the like.

A pump light reflector 630 may also be disposed at the second end of the fiber 624 for reflecting pump light that has passed through the fiber 624 unabsorbed. This may lead to increased pump absorption efficiency, that permits the use of shorter fibers. Furthermore, the device may be configured such that the fiber cavity coupling to the VCSEL cavity is high, and the pump light reflector 630 represents of significant reflectivity contribution to the pump laser cavity. Under this circumstance, one is able to achieve resonantly enhanced absorption of the pump laser light in the fiber cavity. In the optimum case, the pump light absorption in the fiber cavity can be configured to be the predominant source of photon loss out of the pump laser cavity. In this case, efficient pumping can be made to occur for greatly reduced lengths of fiber cavity.

The pump light reflector 630 and the second fiber reflector 628 may each be multiple layer dielectric mirrors deposited on the second end of the fiber 624, or may be separate from the fiber 624.

The fiber 624 has a core 632 that is doped with the excitable species, for example thulium, erbium, holmium, ytterbium, neodymium, promethium, terbium, praseodymium, or the like. The fiber 624 may be a double-clad fiber, with a first cladding 634 surrounding the core and a second cladding 636 surrounding the first cladding. Fiber laser light is confined to the doped core 632, because the effective refractive index for the fiber laser light is less in the first cladding 634 than the core 632. Pump light from the VCSEL portion 602 is coupled into, and is confined by, the first cladding 634, since the effective refractive index for pump light in the first cladding 634 is higher than in the second cladding 636. The pump light, therefore, passes along the fiber core 632 and the first cladding 634. Confinement of the pump light is typically multi-mode confinement. One advantage to using a double-clad fiber is that the coupling of pump light from the VCSEL section 602 into the fiber 624 is very high.

It will be appreciated, of course, that the fiber 624 need not be double clad, and that the pump light from the VCSEL section 602 may be coupled into the fiber core. In such a case, the pump light intensity in the core is higher than with a double clad fiber, but the overall efficiency for coupling pump light into the fiber may be reduced.

It will be further appreciated that the fiber 624 may be a multimode gradient index fiber with an imbedded smaller diameter doped core with single mode or near single mode propagation. This configuration enables the combination of the previously mentioned coupling and propagation benefits of the graded index fiber with the wavelength conversion properties of the excitable species doping.

In some embodiments, the length of the fiber 624 may be around 1 cm. For such a length, it may be desirable to have a relatively high level of doping of excitable species in the fiber core 632. It may also be desirable to have a relatively large core diameter.

In many configurations, the VCSEL cavity is formed between the Bragg high reflector 612 and the VCSEL output coupler 608. Pump light emitted by this cavity passes into the fiber cavity formed between the fiber reflectors 626 and 628. The pump light is absorbed in the doped fiber 624 so as to excite the excitable species in the fiber 624.

The pump light reflector 630 at the second end of the fiber 624 reflects unabsorbed pump light back through the fiber cavity towards the VCSEL section 602. Furthermore, a pump cavity may be formed between the VCSEL output coupler 608 and the pump light reflector 630. Where the frequency of the pump light falls at one of the resonant frequencies of the pump cavity, the pump light may be circulated many times within the pump cavity, thus encouraging higher absorption efficiency of the pump light in the fiber 624. It is preferred that the excitable species not manifest optical gain at the wavelength of the pump light. Where the pump light is resonant in the pump cavity, the length of the fiber 624 used in the fiber laser 606 may be selected more on optimum gain length, rather than on a minimum length driven by the single pass absorption length of the pump light in the fiber 624.

Figure 7:
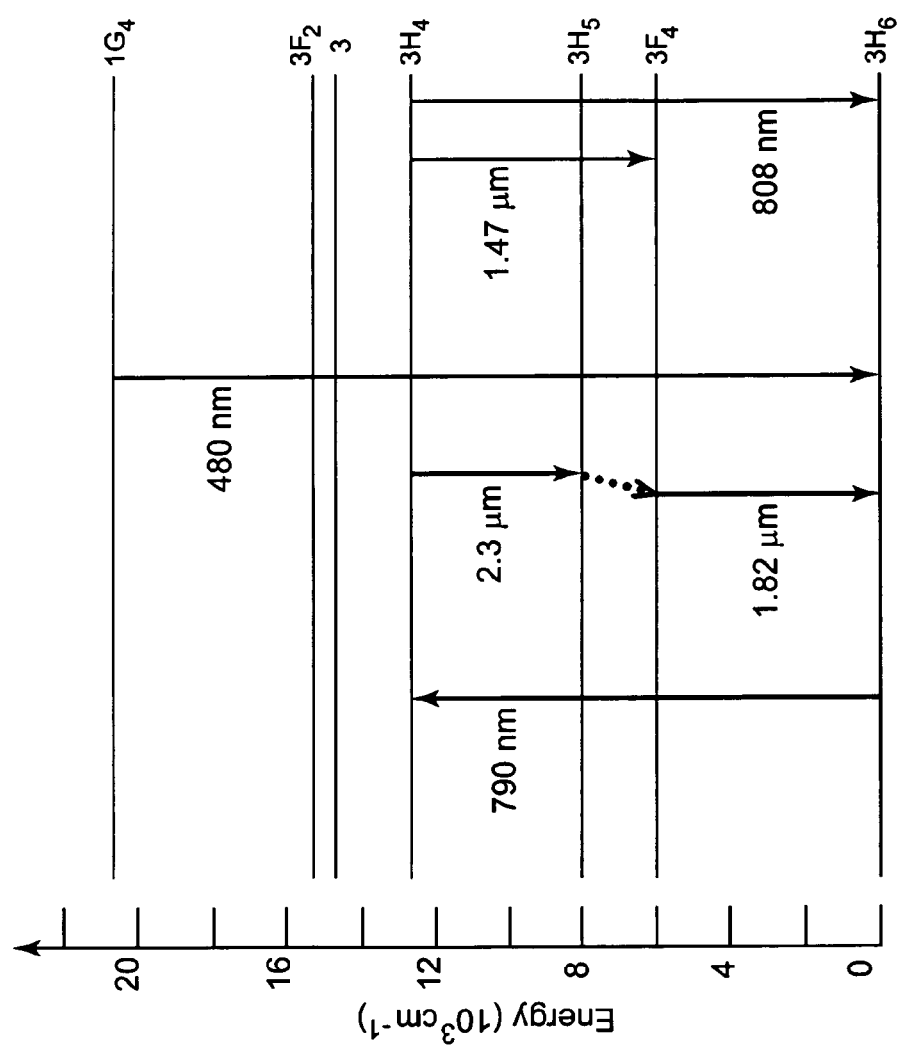
FIG. 7 schematically illustrates an energy level diagram for an intracavity VCSEL pumped fiber laser with emission wavelength substantially longer than the emission wavelength of the VCSEL device.

The VCSEL pump laser may be used to pump the excitable species into an excited state through the absorption of one or more pump photons. One specific example of a VCSEL pumped laser is a thulium-doped fluorozirconate (ZBLAN) optical fiber. A portion of the transition energy diagram for this system, with a specific absorption/emission pathway highlighted, is shown in FIG. 7. The pump photon absorbed by the thulium ion has a wavelength of around 790 nm. Absorption of this pump photon raises the thulium ion to the $^3H_4$ level. There are at least two decays paths from this level to the $^3F_4$ level. One path, which is accompanied by an emission at 2.3 μm, is a two step decay via the $^3H_5$ level, and the other is a direct transition that is accompanied by the emission of a photon at 1.47 μm. The $^3F_4$ level has a transition back to the $^3H_6$ level that is accompanied by emission of a photon at 1.82 μm. Laser oscillation may be achieved on both the $^3H_4$–$^3H_5$ and the $^{3F}_4$–$^3H_6$ transitions, and so the fiber laser may produce light at 2.3 μm and/or 1.82 μm. The fiber laser may thus be used to access emission wavelengths substantially longer than the emission wavelengths available currently to VCSEL devices.

Such a fiber laser is based on the use of a pump photon at 790 nm. A VCSEL laser having an AlGaAs active region may be used to generate pump light at this wavelength.

Figure 8:
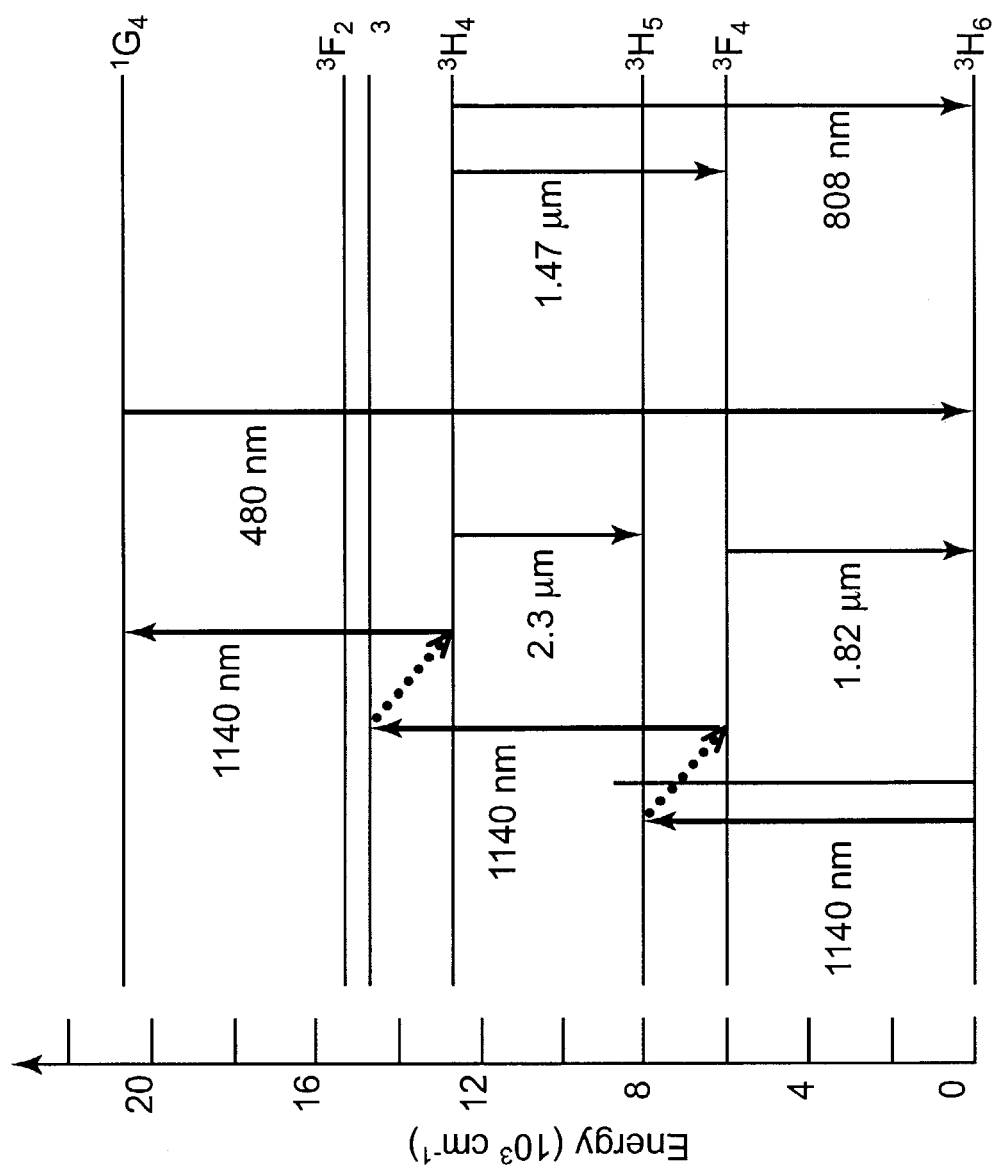
FIG. 8 schematically illustrates an energy level diagram for an intracavity VCSEL pumped fiber laser with emission wavelength substantially shorter than the emission wavelength of the VCSEL device.

Another example of a thulium system, is now described with reference to FIG. 8, which shows an energy level diagram and highlights an upconversion pumping/emission process. This particular upconversion process in thulium includes the absorption of three pump photons at 1140 nm. Pump light at this wavelength may be generated in a VCSEL having an active medium formed of strained InGaAs or strained InGaAsN with a small nitrogen concentration, grown on a GaAs substrate. The three photon absorption results in the thulium ion in the $^1G_4$ state. A transition from the $^1G_4$ state to the $^3H_6$ state is accompanied by the emission of a photon at about 480 nm. It is possible to create a population inversion on this transition and obtain oscillation of a fiber laser at 480 nm. The fiber laser may thus be used to access emission wavelengths substantially shorter than the emission wavelengths available currently to VCSEL devices.

It will be appreciated that the fiber laser may be based on other ionic schemes, using different transitions, different pump wavelength and/or different dopant species.

Typical fiber lengths for the VCSEL-pumped fiber laser may lie in the range from about 0.5 cm to about 10 cm, although the fiber length may also lie outside this range. The concentration for the dopant species may be in the range from 1000 ppm to 30,000 ppm and typical inner core diameters may be in the range from about 3 μm to about 10 μm, although it will be appreciated that the dopant concentration and the fiber core diameter may also lie outside these ranges. Typical values of the various reflectivities of the mirrors for these two thulium examples are presented in Tables III and IV, although it is appreciated that variation of these values is also possible.

TABLE III

Example Mirror Reflectivities for VCSEL-Pumped Fiber Laser Operating at 2.3 μm

| Mirror | 780 nm | 2300 nm | 1820 nm |
|---|---|---|---|
| Bragg HR (612) | 99.99% | | |
| VCSEL OC (608) | 99.10% | | |
| Pump refl. (630) | 99.90% | | |
| 1st Fiber refl. (626) | 1.00% | 99.99% | 1.00% |
| 2nd Fiber refl. (628) | 1.00% | 99.00% | 1.00% |

TABLE IV

Example Mirror Reflectivities for VCSEL-Pumped Fiber Laser Operating at 480 nm

| Mirror | 1140 nm | 480 nm |
|---|---|---|
| Bragg HR (612) | 99.90% | |
| VCSEL OC (608) | 99.10% | |
| Pump refl. (630) | 99.90% | |
| 1st Fiber refl. (626) | 1.00% | 99.99% |
| 2nd Fiber refl. (628) | 1.00% | 99.00% |

It will be appreciated that various modifications may be made to the various embodiments disclosed herein without straying outside the scope of the invention. For example, the refractive index profile of the fiber need not be parabolic, and may have some other type of profile, such as a combination of parabolic and step index.

As noted above, the present invention is applicable to semiconductor VCSELs and is believed to be particularly useful for increasing the low single transverse mode power output, for mode-locked VCSELS, and for extending the wavelength emission range of VCSELs and other semiconductor lasers. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

I claim:

1. A laser device, comprising:
   a vertical cavity, surface emitting laser (VCSEL) section comprising a Bragg reflector, a first gain region and an intracavity reflector formed over a substrate, said VCSEL section having small gain per pass through the first gain region and forming a first resonant cavity between the Bragg reflector and the intracavity reflector,
   an extended cavity section comprising an optical fiber of predetermined length, and having first and second ends, the first end of the optical fiber being optically coupled to the first gain region, wherein said extended cavity section exhibits optical losses comparable to or larger in magnitude to said small gain per pass through said first active region,
   an output coupler/reflector optically coupled to the second end of the extended cavity section, forming a second resonant cavity between the Bragg reflector and the output coupler/reflector;
   said intracavity reflector resulting in insufficient effective reflective magnitude, $R_{eff}$, to provide an effective reflectivity sufficient to initiate lasing operation of said small gain per pass VCSEL section without the inclusion of said output coupler/reflector in said second cavity;
   said intracavity reflector resulting in sufficient effective reflective magnitude, $R_{eff}$, in the presence of both said intracavity reflector and said output coupler/reflector to provide sufficient effective reflectivity, $r_{eff}$, to overcome said optical losses and bring about lasing within both said first and second resonant cavities through the utility of said first gain region;
   said intracavity reflector further being chosen, in combination with said optical fiber predetermined length, such that single longitudinal mode operation is achieved in said first and second resonant cavities; and
   the effective reflective magnitude, $R_{eff}$, of the intracavity reflector approximates the value of $$R_{eff} = |r_{eff}|^2 = \left| \frac{r_2 + r_3}{1 + r_2 r_3} \right|^2$$

where $r_{eff}$ is the effective reflectivity amplitude of said intracavity reflectivity or said output coupler/reflector and $R_{eff}$ is the effective reflective magnitude of said intracavity reflectivity or said output coupler/reflector and $r_2$ and $r_2$ are respectively the reflective amplitude of said intracavity reflector and the output coupler/reflector.

2. A device as recited in claim 1, wherein the output coupler has a reflectivity no less than the reflectivity of the intracavity reflector.

3. A device as recited in claim 1, wherein the optical fiber is a graded index fiber having an associated pitch length.

4. A device as recited in claim 3, wherein the graded index fiber has a length equal to approximately an odd integer multiple of quarter pitch lengths.

5. A device as recited in claim 3, wherein the graded index fiber has a length equal to approximately an even integer multiple of quarter pitch lengths.

6. A device as recited in claim 3, wherein the graded index fiber has a length selected so that light emitted from the second end is approximately collimated.

7. A device as recited in claim 3, further comprising a second resonant cavity in said first gain region formed between the Bragg reflector and the intracavity reflector and spatially adjacent to the first resonant cavity in said first gain region.

8. A device as recited in claim 7, wherein the optical fiber is a graded index fiber having a pitch length and the graded index fiber has a length selected to be approximately an even integer multiple of quarter pitch lengths.

9. A device as recited in claim 7, wherein the first and second resonant cavities are further defined by respective current confining structure that spatially restricts current to flow through the first and second to the first and second cavities.

10. A device as recited in claim 1, wherein the output coupler/reflector is provided at the second end of the optical fiber.

11. A device as recited in claim 1, wherein the substrate is provided with an aperture, the first end of the fiber being optically coupled to the first gain region through the substrate aperture.

12. A device as recited in claim 11, wherein the first end of the optical fiber penetrates at least part way into the aperture.

13. A device as recited in claim 1, wherein the first end of the optical fiber is physically attached to the VCSEL section.

14. A device as recited in claim 13, wherein the substrate is provided with an aperture, the first end of the fiber is optically coupled to the first gain region through the substrate aperture, and the first end of the fiber is physically attached to the substrate.

15. A device of claim 1 wherein said laser device operates on a single transverse mode.

16. A device of claim 1 wherein said laser device operates on multiple transverse modes.

17. A device of claim 1 wherein said fiber is a multiple mode fiber.

18. A device of claim 1 wherein said laser device operates with more than one operational wavelength.

19. A device of claim 1, the intracavity reflector having a reflectivity equal to or less than a reflectivity of the output coupler.

20. A device of claim 1 wherein the length of the extended cavity section is on the order of one centimeter.

21. A laser device, comprising:
   a vertical cavity, surface emitting laser (VCSEL) section comprising a Bragg reflector, a first gain region and an intercavity reflector formed over a substrate, said VCSEL section baying small gain per pass through the first gain region and forming a first resonant cavity between the Bragg reflector and the intracavity reflector,
   an extended cavity section comprising a multiple mode optical fiber having first and second ends, the first end of the optical fiber being optically coupled to the gain region, wherein said extended cavity section exhibits optical losses comparable to or larger in magnitude to said small gain per pass through said first active region;
   an output coupler/reflector being optically coupled to the second end forming a second resonant cavity between the Bragg reflector and the output coupler/reflector,
   said intracavity reflector resulting in insufficient effective reflective magnitude, $R_{eff}$, to provide an effective reflectivity sufficient to initiate lasing operation of mid small gain per pass VCSEL section without the inclusion of said output coupler/reflector in said second cavity;
   said intracavity reflector resulting in sufficient effective reflective magnitude, $R_{eff}$, in the presence of both said intracavity reflector and said output coupler/reflector to provide sufficient effective reflectivity, $R_{eff}$, to overcome said optical losses and bring about lasing within both said first and second resonant cavities trough the utility of said first gain region;

the effective reflective magnitude, $R_{eff}$, of the intracavity reflector approximates the value of $$R_{eff} = |r_{eff}|^2 = \left|\frac{r_2 + r_3}{1 + r_2 r_3}\right|^2$$

where $r_{eff}$ is the effective reflectivity amplitude of said intracavity reflectivity or said output coupler/reflector and $R_{eff}$ is the effective reflective magnitude of said intracavity reflectivity or said output coupler/reflector and $r_2$ and $r_3$ are respectively the reflective amplitude of said intracavity reflector and the output coupler/reflector.

22. A device as recited in claim 21, wherein the output coupler/reflector is provided at the second end at the optical fiber.

23. A device as recited in claim 21, wherein the intracavity reflector having a reflective magnitude, $R_{eff}$, less than a reflective magnitude of the output coupler/reflector.

24. A device as recited in claim 23, wherein the intracavity reflector has a reflective magnitude, $R_{eff}$, less tan one third of the reflective magnitude of the output coupler/reflector.

25. A device as recited in claim 21, wherein the extended cavity section provides an effective reflective magnitude higher than a reflective magnitude of the intracavity reflector.

26. A device as recited in claim 21, wherein the optical fiber is a graded index optical fiber.

27. A device as recited in claim 26, wherein the graded index fiber has a length equal to approximately an odd integer multiple of quarter pitch lengths.

28. A device as recited in claim 26, wherein the graded index fiber has a length equal to approximately an even integer multiple of quarter pitch lengths.

29. A device as recited in claim 26, wherein the graded index fiber has a length selected so that light emitted out of the second end of the graded index fiber is approximately collimated.

30. A device as recited in claim 21, further comprising a modulating power supply coupled to supply current through the gain region.

31. A device as recited in claim 21, wherein the laser device is mode locked.

32. A device as recited in claim 21, wherein the substrate is provided with an aperture and the first end of the optical fiber is optically coupled to the gain region through the aperture in the substrate.

33. A device as recited in claim 32, wherein the first end of the optical fiber penetrates at least part way into the aperture.

34. A device as recited in claim 32, wherein the first end of the optical fiber is attached to the VCSEL section.

35. A device as recited in claim 21, further comprising a second resonant cavity in said first gain region formed between the Bragg reflector and the intracavity reflector and spatially adjacent to the first resonant cavity in said first gain region.

36. A laser device, comprising:
a vertical cavity, surface emitting laser (VCSEL) section comprising a Bragg reflector and having a plurality of spatially adjacent resonant cavities in a gain region formed within said VCSEL section over a substrate which resonant cavities provide a plurality of light sources in said VCSEL section; and an extended cavity section comprising a graded index optical fiber having first and second ends and an associated pitch length, the first end of the optical fiber being optically coupled to the VCSEL spatially adjacent resonant cavities;

an output coupler/reflector optically coupled to the second end of the graded index optical fiber, a plurality of laser cavities created within both of the VCSEL section and the extended cavity section between the Bragg reflector in said VCSEL section and the output coupler/reflector at the second end of said graded index optical fiber where each of said formed laser cavities includes one of said VCSEL resonant cavities.

37. A device as recited in claim 36, wherein the output coupler/reflector is provided at the second end of the optical fiber.

38. A device as recited in claim 36, wherein the VCSEL section further comprises an intracavity reflector between said VCSEL spatially adjacent resonant cavities and the first end of the optical fiber.

39. A device as recited in claim 36, wherein the graded index fiber has a length equal to approximately an even integer multiple of quarter pitch lengths.

40. A device as recited in claim 36, further comprising a modulating power supply coupled to supply current through said VCSEL spatially adjacent resonant cavities.

41. A device as recited in claim 36, wherein the substrate is provided with an aperture and the first end of the optical fiber and is optically coupled to said VCSEL spatially adjacent resonant cavities through the aperture in the substrate.

42. A device as recited in claim 41, wherein the first end of the optical fiber penetrates at least part way into the aperture.

43. A device as recited in claim 41, wherein the first end of the optical fiber is attached to the substrate.

44. A device as recited in claim 36, wherein said VCSEL spatially adjacent resonant cavities are defined by respective current confining structure that restricts current to flow through each of the respective VCSEL spatially adjacent resonant cavities.

45. A laser device, comprising:
a semiconductor laser comprising at least a first pump mirror with high reflector and a first pump gain region formed over a substrate;

an optical fiber forming a second gain region having first and second ends;

the first end of the optical fiber being optically coupled to the first gain region;

the optical fiber being doped with an excitable species manifesting optical gain in the second gain region when pumped with light at a pump wavelength generated by the semiconductor laser first pump gain region, the optical fiber forming a fiber laser resonant cavity between first and second fiber laser mirrors at the ends of the fiber laser cavity;

a pump light reflector coupled to the second end of the optical fiber, forming a semiconductor resonant cavity between the second end pump light reflector and the high reflector for reflecting light at the pump wavelength back both through second gain region to achieve enhanced absorption of the pump light in the fiber laser resonant cavity and back into the first pump gain region to provide reflected light contribution to the semiconductor laser resonant cavity.

46. A device as recited in claim 45, wherein the semiconductor laser is a vertical cavity, surface emitting laser (VCSEL) and the high reflector is a Bragg reflector.

47. A device as recited in claim 45, wherein the semiconductor laser comprises a pump light reflecting output coupler disposed between the first gain region and the first end of the optical fiber.

48. A device as recited in claim 47, further comprising a resonant pump cavity formed between the output coupler and the pump light reflector at the second end of the optical fiber, the resonant pump cavity comprising the optical fiber.

49. A device as recited in claim 45, wherein the first fiber laser mirror comprises a coating disposed on the first end of the optical fiber.

50. A device as recited in claim 45, wherein the second fiber laser mirror comprises a fiber laser output coupler disposed on the second end of the optical fiber.

51. A device as recited in claim 45, wherein the excitable species is a rare earth ion.

52. A device as recited in claim 45, wherein the excitable species manifests gain for light having a wavelength longer than the light at the pump wavelength.

53. A device as recited in claim 45, wherein the excitable species manifests gain fur light having a wavelength shorter than the light at the pump wavelength.

54. A device as recited in claim 53, wherein the excitable species comprises at least one of thulium, erbium, holmium, ytterbium, neodymium, promethium, terbium, and praseodymium.

55. A device as recited in claim 45, wherein the optical fiber is a graded index fiber.

56. A device as recited in claim 45, wherein the optical fiber comprises a doped fiber core, a first fiber cladding and a second fiber cladding, light at a fiber laser wavelength being confined within the doped fiber core and the light at the pump wavelength being confined within the first fiber cladding.

57. A device as recited in claim 45, wherein the substrate is provided with an aperture and the first end of the optical fiber is optically coupled to the first gain region through the aperture in the substrate.

58. A device as recited in claim 57, wherein the first end of the optical fiber penetrates at least part way into the aperture.

59. A device as recited in claim 57, wherein the first end of the optical fiber is attached to the substrate.

60. A device of claim 45 wherein the semiconductor laser is an edge emitting semiconductor laser.

61. A device of claim 45 wherein the excitable species comprises at least one of thulium, erbium, holmium, ytterbium, neodymium promethium, terbium, and praseodymium.

62. A device as recited in claim 45, wherein at least one of said first and second fiber laser mirrors is a fiber Bragg grating mirror fabricated within said optical fiber.

63. A laser device, comprising:
a semiconductor laser having a first pump mirror forming part of a first resonator that generates light of a first wavelength;
an optical fiber optically coupled to the semiconductor laser and doped with an excitable species manifesting optical gain when pumped with light at the first wavelength generated by the first resonator;
the optical fiber having first and second ends with, respectively, first and second fiber mirrors forming a second resonator to generate light of at least one second wavelength, and wherein the first end of the optical fiber is coupled to the semiconductor laser;
a second pump mirror at the second end of the optical fiber for reflecting the pump light at the first wavelength back into both the first and second resonators; the first and second pump mirrors comprising the first resonator which includes the second resonator.

64. The laser device of claim 63 further comprising a third pump mirror between the first pump mirror and the first fiber minor at the first end of the fiber, the third pump mirror providing for reflection of a first part of reflected pump light from the second pump mirror back into the second resonator and permitting transmission of a second part of reflected pump light from the second pump mirror through the third pump mirror toward the first pump minor, the first and third pump mirrors comprising a third resonator.

* * * * *